US010971338B2

(12) United States Patent
Arita et al.

(10) Patent No.: US 10,971,338 B2
(45) Date of Patent: Apr. 6, 2021

(54) ACTIVE GAS GENERATING APPARATUS

(71) Applicant: TOSHIBA MITSUBISHI-ELECTRIC INDUSTRIAL SYSTEMS CORPORATION, Chuo-ku (JP)

(72) Inventors: Ren Arita, Tokyo (JP); Kensuke Watanabe, Tokyo (JP); Shinichi Nishimura, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 0 days.

(21) Appl. No.: 16/621,449

(22) PCT Filed: Sep. 6, 2017

(86) PCT No.: PCT/JP2017/032060
§ 371 (c)(1),
(2) Date: Dec. 11, 2019

(87) PCT Pub. No.: WO2019/049230
PCT Pub. Date: Mar. 14, 2019

(65) Prior Publication Data
US 2020/0152424 A1    May 14, 2020

(51) Int. Cl.
*H01J 37/32* (2006.01)

(52) U.S. Cl.
CPC .... *H01J 37/32348* (2013.01); *H01J 37/3244* (2013.01); *H01J 37/32568* (2013.01); *H01J 2237/332* (2013.01)

(58) Field of Classification Search
CPC ........... H01J 37/32009; H01J 37/32045; H01J 37/32559; H01J 37/32348;
(Continued)

(56) References Cited

U.S. PATENT DOCUMENTS 5,373,528 A * 12/1994 Kuzumoto ............ H01S 3/0315
372/35
6,074,518 A * 6/2000 Imafuku ........... H01J 37/32623
118/723 E
(Continued)

FOREIGN PATENT DOCUMENTS

DE    198 26 418 A1    12/1999
JP    5694543 B2    4/2015

OTHER PUBLICATIONS

International Search Report dated Nov. 21, 2017 in PCT/JP2017/032060 filed Sep. 6, 2017, 2 pages.
(Continued)

*Primary Examiner* — Tung X Le
(74) *Attorney, Agent, or Firm* — Xsensus LLP

(57) ABSTRACT

In an active gas generating apparatus, a power feeder is provided above metal electrodes in an integrated high-voltage electrode unit. When seen in plan view, the power feeder has a shape that entirely covers the metal electrodes in the integrated high-voltage electrode unit. Each of power feeding units is provided below the metal electrodes in an integrated ground electrode unit. When seen in plan view, each of the power feeding units has a shape that entirely covers the metal electrodes of the integrated ground electrode unit.

4 Claims, 7 Drawing Sheets

(58) Field of Classification Search
CPC ......... H01J 37/32724; C23C 16/45517; C23C 16/45563; C23C 16/45578
USPC .................................................. 315/111.21
See application file for complete search history.

(56) References Cited

U.S. PATENT DOCUMENTS

| | | | | |
|---|---|---|---|---|
| 8,721,796 | B2* | 5/2014 | Deehan | B08B 7/0035 |
| | | | | 134/1.1 |
| 8,857,371 | B2* | 10/2014 | Tabata | H01J 37/32009 |
| | | | | 118/723 ER |
| 2008/0245659 | A1* | 10/2008 | Matsuno | C01B 13/11 |
| | | | | 204/242 |
| 2017/0241021 | A1* | 8/2017 | Tabata | C23C 16/50 |
| 2018/0005836 | A1* | 1/2018 | Lim | H01L 21/32051 |
| 2018/0067082 | A1* | 3/2018 | Shinada | G01N 27/70 |

OTHER PUBLICATIONS

Extended European Search Report dated Dec. 4, 2020 in European Application No. 17924633.5.

* cited by examiner

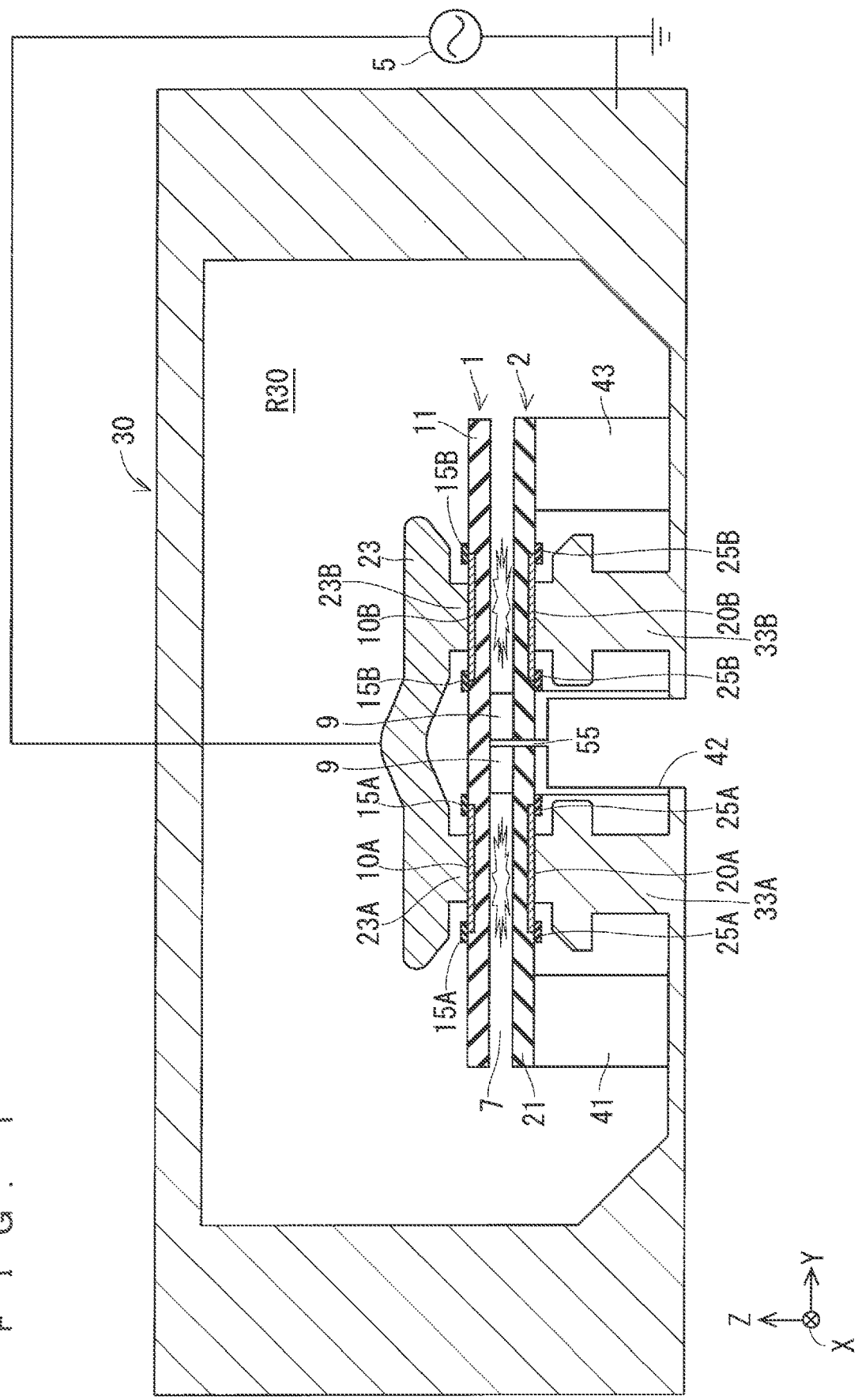
F I G . 1

F I G . 7
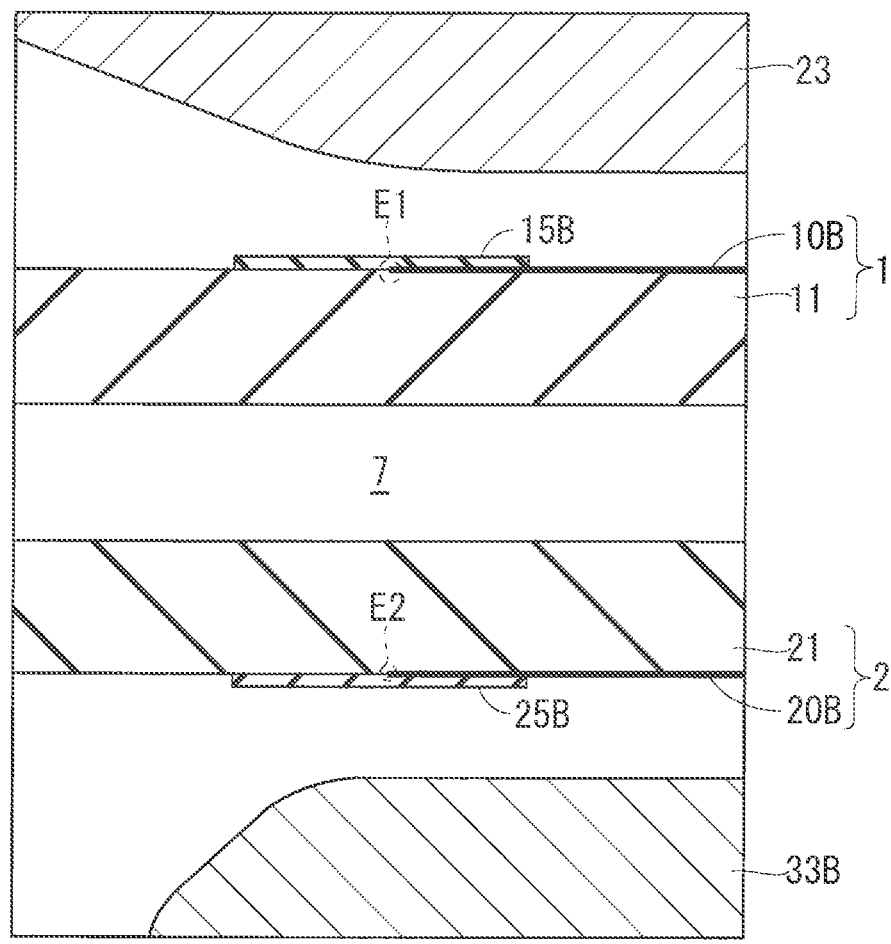

ACTIVE GAS GENERATING APPARATUS

TECHNICAL FIELD

The present invention relates to an active gas generating apparatus in which a high voltage dielectric electrode and a low voltage dielectric electrode are provided in parallel to each other, and high voltage is applied between the high voltage dielectric electrode and the low voltage dielectric electrode to cause discharge which generates energy, through which an active gas is obtained.

BACKGROUND ART

A type of active gas generating apparatus uses dielectric barrier discharge that is generated in a discharge space formed between a pair of dielectric electrodes. The dielectric barrier discharge generates an active gas required for a nitriding process, an oxidizing process, and the like for a semiconductor.

Such a conventional active gas generating apparatus using dielectric barrier discharge includes, for example, a plasma generating apparatus disclosed in Patent Document 1. This plasma generating apparatus causes the dielectric barrier discharge in a discharge space formed between a high-voltage electrode unit and a ground electrode unit, each unit disposed opposite the other, and generates an active gas by flowing a source gas into the discharge space.

PRIOR ART DOCUMENT

Patent Document

Patent Document 1: JP 5694543 B2

SUMMARY

Problem to be Solved by the Invention

However, the conventional active gas generating apparatus using the dielectric barrier discharge may have an occurrence of abnormal discharge, i.e., a type of discharge in unwanted areas, other than the discharge space, caused by a dielectric breakdown in a surrounding gas flow.

The abnormal discharge occurring in unwanted areas other than the discharge space causes evaporation of a constituent element of a component in a vicinity of the abnormal discharge, and when the component in the vicinity includes a metallic element, the evaporation causes metal contamination in a film formation process in forming a semiconductor film, resulting in degraded performance of the semiconductor manufactured.

Additionally, when the conventional active gas generating apparatus is used under reduced pressure, an electric field intensity required for the dielectric breakdown becomes smaller than under atmospheric pressure, and the usage environment is thus more prone to causing the abnormal discharge. In the usage environment, the electric field intensity at an outer edge of each metal electrode, the metal electrode formed by a metalizing process on a surface of each dielectric electrode, is relatively increased. Accordingly, the outer edge of the metal electrode is prone to cause the dielectric breakdown in the surrounding gas flow, in other words, to cause the abnormal discharge.

In view of the problems above, an object of the present invention is to provide a configuration of an active gas generating apparatus configured to suppress abnormal discharge.

Means to Solve the Problem

An active gas generating apparatus according to the present invention generates an active gas obtained by activating a source gas supplied to a discharge space. The active gas generating apparatus includes; a first integrated electrode unit; a second integrated electrode unit that is provided below the first integrated electrode unit; and an alternating current source that applies alternating current voltage to the first integrated electrode unit and the second integrated electrode unit so as to cause the first integrated electrode unit to be supplied with high voltage. The alternating current source applies the alternating current voltage to form the discharge space between the first integrated electrode unit and the second integrated electrode unit, the discharge space is supplied with a source gas that is activated to result in an active gas, the active gas being ejected from a gas ejection port that is provided in the second integrated electrode unit, the first integrated electrode unit includes a first dielectric electrode, and a first metal electrode selectively formed on an upper face of the first dielectric electrode, and the second integrated electrode unit includes a second dielectric electrode, and a second metal electrode selectively formed on a bottom face of the second dielectric electrode. The active gas generating apparatus further includes: a first power feeding unit that is provided above the first metal electrode and configured to transmit the alternating current voltage to the first metal electrode; and a second power feeding unit that is provided below the second metal electrode and configured to transmit the alternating current voltage to the second metal electrode. The first power feeding unit has a shape covering the first metal electrode entirely in plan view.

Effects of the Invention

In the active gas generating apparatus according to the present invention, the first power feeding unit has a shape covering the first metal electrode entirely in plan view. With this configuration, the first power feeding unit disposed above the first metal electrode of the high-voltage unit equalizes potential across a region surrounding an outer edge of the first metal electrode so as to control an electric field intensity at the outer edge of the first metal electrode at low level.

Consequently, the active gas generating apparatus according to the present invention can effectively suppress an occurrence of abnormal discharge at the outer edge of the first metal electrode.

The objects, features, aspects, and advantages of the present invention will be more apparent from the following detailed description and the accompanying drawings.

BRIEF DESCRIPTION OF DRAWINGS

FIG. 1 is an illustrative diagram illustrating a configuration of an active gas generating apparatus according to an embodiment of the present invention.

FIG. 7 is an illustrative diagram illustrating a result of the simulation (No. 2) in the active gas generating apparatus according to the embodiment.

DESCRIPTION OF EMBODIMENT

Embodiment (Configuration)

Figure 2:
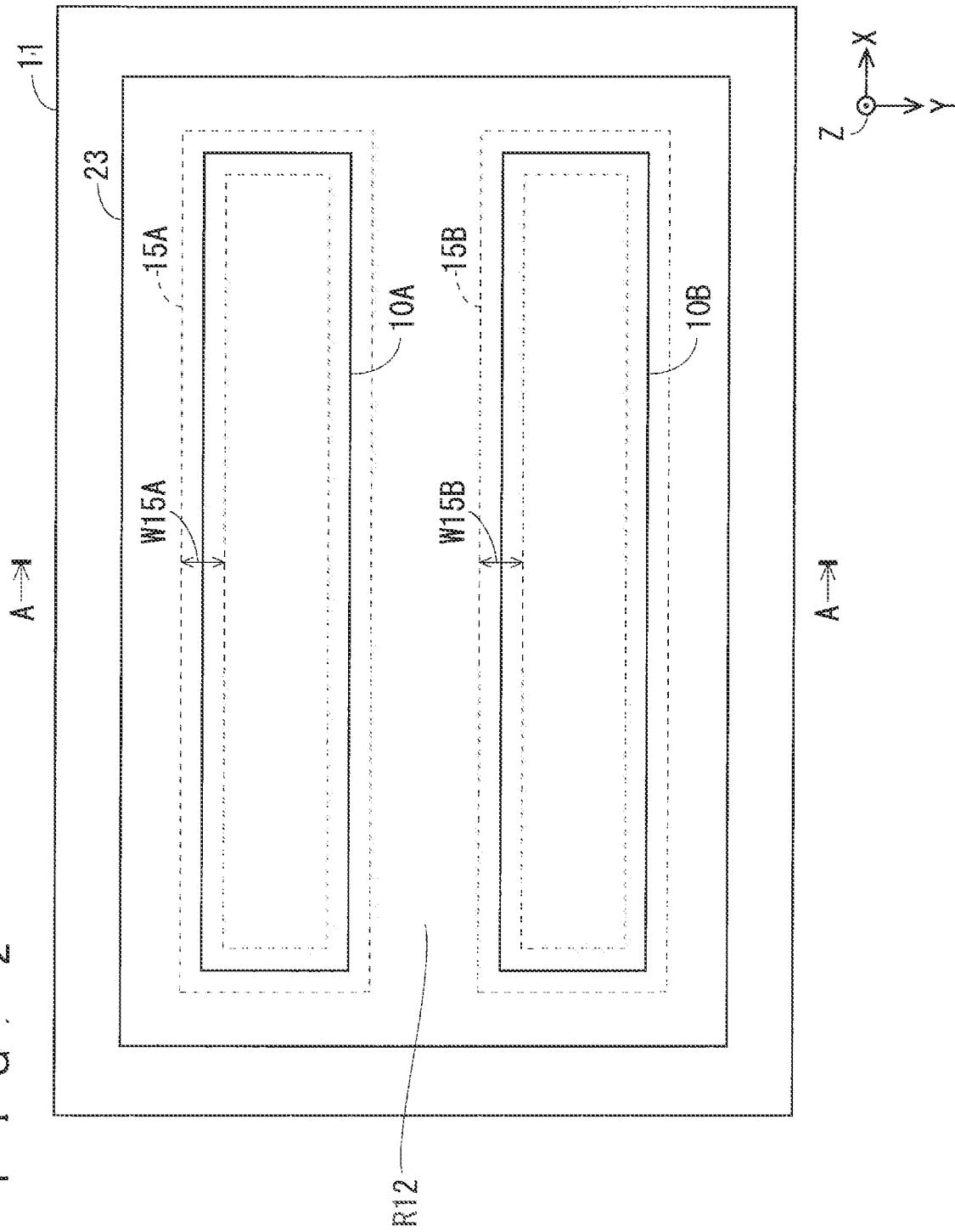
FIG. 2 is an illustrative diagram illustrating a planar configuration of an integrated high-voltage electrode unit in FIG. 1.

FIG. 1 is an illustrative diagram illustrating a configuration of an active gas generating apparatus according to an embodiment of the present invention. In FIG. 1, an X-Y-Z orthogonal coordinate system is used.

As illustrated in FIG. 1, the active gas generating apparatus according to the embodiment includes, as main components, an integrated high-voltage electrode unit 1, an integrated ground electrode unit 2, a high frequency power source 5, a metal housing 30 (that includes power feeding units 33A and 33B), a power feeder 23, and support stands 41 to 43. Each of the power feeding units 33A and 33B may be provided as a separate component from the metal housing 30 on a condition that each of the power feeding units 33A and 33B is electrically connected to the metal housing 30.

The integrated high-voltage electrode unit 1 as a first integrated electrode unit and the integrated ground electrode unit 2 as a second integrated electrode unit are provided opposite and in parallel to each other, and the integrated ground electrode unit 2 is provided below the integrated high-voltage electrode unit 1.

The high frequency power source 5 as an alternating current source applies high voltage to the integrated high-voltage electrode unit 1 via the power feeder 23 to apply alternating current voltage to the integrated high-voltage electrode unit 1 and the integrated ground electrode unit 2 to cause the integrated high-voltage electrode unit 1 to be supplied with high voltage, so that the integrated ground electrode unit 2 is supplied with ground voltage via the power feeding unit 33 of the metal housing 30.

The high frequency power source 5 applies the alternating current voltage to generate dielectric barrier discharge in a discharge space 7 between the integrated high-voltage electrode unit 1 and the integrated ground electrode unit 2. The discharge space 7 is supplied with a source gas (not illustrated) that is activated to result in an active gas. Then, the active gas is ejected from a gas ejection port 55 that is provided in the integrated ground electrode unit 2.

Figure 3:
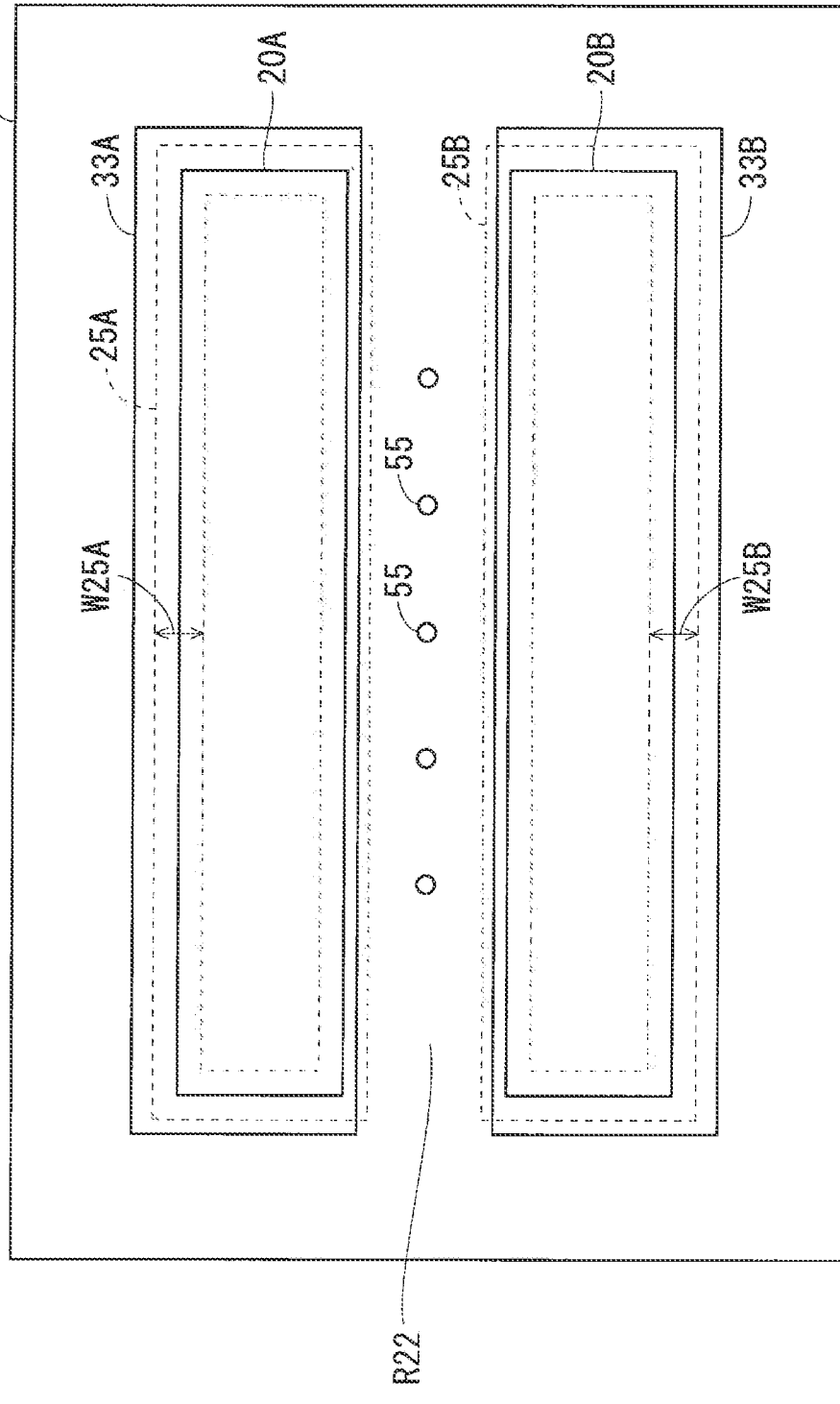
FIG. 3 is an illustrative diagram illustrating a planar configuration of an integrated ground electrode unit in FIG. 1.

FIG. 2 is an illustrative diagram illustrating a planar configuration of the integrated high-voltage electrode unit 1. The planar structure of the integrated high-voltage electrode unit 1 is illustrated as viewed from above (i.e., in a positive Z-axis direction). FIG. 3 is an illustrative diagram illustrating a planar configuration of the integrated ground electrode unit 2. The planar structure of the integrated ground electrode unit 2 is illustrated as viewed from below (i.e., in a negative Z-axis direction). The integrated high-voltage electrode unit 1 in FIG. 1 is a sectional view taken along line A-A in FIG. 2, and the integrated ground electrode unit 2 in FIG. 1 is a sectional view taken along line B-B in FIG. 3. In each of FIGS. 2 and 3, the X-Y-Z orthogonal coordinate system is used.

The integrated high-voltage electrode unit 1 includes a dielectric electrode 11 serving as a first dielectric electrode, a metal electrode 10A, and a metal electrode 10B. Each of the metal electrodes 10A and 10B serves as a first metal electrode and is selectively formed on an upper face of the dielectric electrode 11.

The integrated ground electrode unit 2 includes a dielectric electrode 21 serving as a second dielectric electrode, a metal electrode 20A, and a metal electrode 20B. Each of the metal electrodes 20A and 20B serves as a second metal electrode and is selectively formed on a bottom face of the dielectric electrode 21.

Each of the dielectric electrode 11 and the dielectric electrode 21 has a substantially rectangular-shaped flat plate configuration that extends in an X-axis direction as its longitudinal direction and in a Y-axis direction as its lateral direction.

As illustrated in FIGS. 1 and 3, the metal electrode 20A and the metal electrode 20B (each being one of the pair of second metal electrodes) are formed on the bottom face of the dielectric electrode 21, and in plan view, are disposed opposite each other across a central region R22 on the dielectric electrode 21. The metal electrodes 20A and 20B, each having a substantially rectangular shape and extending in the X-axis direction as its longitudinal direction, face opposite each other in the Y-axis direction in plan view. The metal electrodes 20A and 20B have an equal size in plan view, and are disposed symmetrically with respect to the central region R22.

Similarly, as illustrated in FIGS. 1 and 2, the metal electrode 10A and the metal electrode 10B (each being one of the pair of first metal electrodes) are formed on the upper face of the dielectric electrode 11, and in plan view, are disposed opposite each other across a central region R12 on the dielectric electrode 11. The metal electrodes 10A and 10B, each having a substantially rectangular shape and extending in the X-axis direction as its longitudinal direction, face opposite each other in the Y-axis direction in plan view. The metal electrodes 10A and 10B have an equal size in plan view, and are disposed symmetrically with respect to the central region R12. The central region R12 and the central region R22 have an exactly identical shape and are thus provided to entirely overlap each other in plan view. Accordingly, the metal electrode 10A and the metal electrode 10B are respectively positioned to have a region overlapping the metal electrode 20A and the metal electrode 20B in plan view.

Note that each of the metal electrodes 10A and 10B is formed by a metalizing process on the upper face of the dielectric electrode 11, and each of the metal electrodes 20A and 20B is formed by the metalizing process on the bottom face of the dielectric electrode 21. As a result, the dielectric electrode 11, the metal electrode 10A, the metal electrode 10B are integrally formed to constitute the integrated high-voltage electrode unit 1 (as the first integrated electrode unit). The dielectric electrode 21, the metal electrode 20A, and the metal electrode 20B are integrally formed to constitute the integrated ground electrode unit 2 (as the second integrated electrode unit). The metallizing process includes a printing firing method, a sputtering process, a vapor deposition process, and the like.

As illustrated in FIGS. 1 and 3, the central region R22 on the dielectric electrode 21 (a region where, as seen in plan view, the metal electrodes 10A and 20A do not overlap each other as well as the metal electrodes 10B and 20B do not overlap each other) includes, for example, five gas ejection ports 55 provided linearly in the X-axis direction.

In the active gas generating apparatus according to this embodiment, as illustrated in FIG. 1, the integrated high-voltage electrode unit 1 and the integrated ground electrode unit 2, each configured as described above, are accommodated in the metal housing 30.

The integrated ground electrode unit 2 is supported at its bottom face by the power feeding unit 33 (power feeding units 33A and 33B) and the support stands 41 to 43. The power feeding unit 33 (power feeding units 33A and 33B) is provided at a bottom part of the metal housing 30. The support stand 41 to 43 are provided on a bottom face of an accommodating space R30 in the metal housing 30 and are spaced apart from each other. In this state, the power feeding unit 33A is disposed to have an upper face of the power feeding unit 33A to be in contact with a bottom face of the metal electrode 20A. The power feeding unit 33B is disposed to have an upper face of the power feeding unit 33B to be in contact with a bottom face of the metal electrode 20B. The support stand 42 has an opening in a planar region where the support stand 42 is connected to the gas ejection port 55. The active gas obtained in the discharge space 7 is thus ejected downward via the gas ejection port 55 and the opening.

The integrated high-voltage electrode unit 1 is disposed above the integrated ground electrode unit 2. The integrated high-voltage electrode unit 1 and the integrated ground electrode unit 2 have a gap therebetween as the discharge space 7, and a length of the gap is defined by a pair of spacers 9 provided between the integrated high-voltage electrode unit 1 and the integrated ground electrode unit 2. The pair of spacers 9 are provided to face opposite each other across the gas ejection port 55 in plan view. Each of the pair of spacers 9 has a plurality of through holes (not illustrated) extending in the Y-axis direction. With this configuration, the active gas obtained in the discharge space 7 is ejected from the gas ejection port 55 provided in the dielectric electrode 21, by means of these plurality of through holes.

The power feeder 23 made of metal is provided above the integrated high-voltage electrode unit 1 and includes a projection 23A and a projection 23B, each of which is selectively projected downward (in the negative Z-axis direction). The power feeder 23 is disposed above the integrated high-voltage electrode unit 1 so as to have a bottom face of the projection 23A to be in contact with an upper face of the metal electrode 10A and to have a bottom face of the projection 23B to be in contact with an upper face of the metal electrode 10B.

The power feeder 23 as a first power feeding unit is provided above the metal electrodes 10A and 10B so that the alternating current voltage is transmitted to the metal electrodes 10A and 10B. Note that current introduction terminals connected to the power feeder 23 for power supply are not illustrated in FIG. 1.

As illustrated in FIG. 2, the power feeder 23 has a shape covering the metal electrodes 10A and 10B entirely in plan view.

On the other hand, the power feeding unit 33 (power feeding units 33A and 33B) as a second power feeding unit is provided below the metal electrodes 20A and 20B so as to have the upper face of the power feeding unit 33A to be in contact with the bottom face of the metal electrode 20A and to have the upper face of the power feeding unit 33B to be in contact with the bottom face of the metal electrode 20B. With this configuration, ground voltage as a reference level of the alternating current voltage is transmitted to each of the metal electrodes 20A and 20B.

As illustrated in FIG. 3, the power feeding unit 33A has a shape covering the metal electrode 20A entirely in plan view, and the power feeding unit 33B has a shape covering the metal electrode 20B entirely in plan view. In other words, the power feeding unit 33 formed of the power feeding units 33A and 33B has a shape covering the metal electrodes 20A and 20B entirely.

As illustrated in FIGS. 1 and 2, a covering dielectric 15A is formed on the upper face of the dielectric electrode 11 and on a part of the metal electrode 10A such that an outer edge of the metal electrode 10A is entirely covered. Similarly, a covering dielectric 15B is formed on the upper face of the dielectric electrode 11 and on a part of the metal electrode 10B such that an outer edge of the metal electrode 10B is entirely covered.

As described above, each of the covering dielectrics 15A and 15B serves as a first dielectric film and is formed on an upper face of the dielectric electrode 11 so as to cover the outer edge of a corresponding one of the metal electrodes 10A and 10B as the first metal electrodes. The covering dielectrics 15A and 15B constitute a pair of first dielectric film parts.

Additionally, as illustrated in FIGS. 1 and 3, a covering dielectric 25A is formed on the bottom face of the dielectric electrode 21 and under a part of the metal electrode 20A such that an outer edge of the metal electrode 20A is entirely covered. Similarly, a covering dielectric 25B is formed on the bottom face of the dielectric electrode 21 and under a part of the metal electrode 20B such that an outer edge of the metal electrode 20B is entirely covered.

As described above, each of the covering dielectrics 25A and 25B serves as a second dielectric film and is formed on the bottom face of the dielectric electrode 21 so as to cover the outer edge of a corresponding one of the metal electrodes 20A and 20B as the second metal electrodes. The covering dielectrics 25A and 25B constitute a pair of second dielectric film parts.

Each of the covering dielectrics 15A and 15B as well as each of the covering dielectrics 25A and 25B may be made of, for example, glass paste, alumina, or preferably a constituent material having a high dielectric constant.

The active gas generating apparatus according to this embodiment, configured as described above, is provided immediately above a process chamber (not illustrated) that performs a film formation process on an object subjected to the film formation process such as a silicon wafer.

In the active gas generating apparatus according to this embodiment, the high frequency power source 5 applies the alternating current voltage set at 10 kHz to 100 kHz with $V0p$ (0 peak value) at 2 to 10 kV between the integrated high-voltage electrode unit 1 and the integrated ground electrode unit 2, so as to generate the dielectric barrier discharge in the discharge space 7.

The active gas generating apparatus according to this embodiment supplies a gas such as a nitrogen, an oxygen, a rare gas, a hydrogen, and a fluorine into the discharge space 7 through a gas supply port (not illustrated). The gas is activated inside the discharge space 7, and the gas (containing the active gas) is ejected from the gas ejection port 55 provided in the dielectric electrode 21 of the integrated ground electrode unit 2 into the process chamber below.

Then, the film formation process is executed on the object subjected to the film formation process in the process chamber.

(Effect)

The active gas generating apparatus according to this embodiment has a first feature that the power feeder 23 as the first power feeding unit has the shape covering the metal electrode 10A and the metal electrode 10B, each serving as the first metal electrode, entirely in plan view. With the first feature in the active gas generating apparatus according to this embodiment, the power feeder 23 disposed above the metal electrodes 10A and 10B equalizes potential across a region surrounding the outer edge of each of the metal electrodes 10A and 10B. Thus, an electric field intensity at the outer edge of each of the metal electrodes 10A and 10B is controlled at low level.

Consequently, the active gas generating apparatus according to this embodiment effectively suppresses an occurrence of abnormal discharge at the outer edge of each of the metal electrodes 10A and 10B.

The active gas generating apparatus according to this embodiment also has a second feature that the power feeding unit 33 (power feeding units 33A and 33B) as the second power feeding unit has the shape covering the metal electrode 20A and the metal electrode 20B entirely in plan view. With the second feature in the active gas generating apparatus according to this embodiment, the power feeding unit 33 disposed below the metal electrodes 20A and 20B equalizes potential across a region surrounding the outer edge of each of the metal electrodes 20A and 20B. Thus, an electric field intensity at the outer edge of each of the metal electrodes 20A and 20B is controlled at low level.

Consequently, the active gas generating apparatus according to this embodiment effectively suppresses an occurrence of abnormal discharge at the outer edge of each of the metal electrodes 20A and 20B.

Additionally, in the active gas generating apparatus according to this embodiment, the covering dielectrics 15A and 15B, each serving as the first dielectric film, is formed on the upper face of the dielectric electrode 11 to cover the outer edge of the corresponding one of the metal electrodes 10A and 10B. With this configuration, the electric field intensity at the outer edge of each of the metal electrodes 10A and 10B is reduced.

Similarly, in the active gas generating apparatus according to this embodiment, the covering dielectrics 25A and 25B, each serving as the second dielectric film, is formed on the bottom face of the dielectric electrode 21 to cover the outer edge of the corresponding one of the metal electrodes 20A and 20B. With this configuration, the electric field intensity at the outer edge of each of the metal electrodes 20A and 20B is reduced.

Consequently, the active gas generating apparatus according to this embodiment is further effective in suppressing the occurrence of abnormal discharge at the outer edge of each of the metal electrode 10A, the metal electrode 10B, the metal electrode 20A, and the metal electrode 20B.

Further, the active gas generating apparatus according to this embodiment includes the metal electrodes 10A and 10B (a pair of first metal electrode parts) in the integrated high-voltage electrode unit 1 as well as the metal electrodes 20A and 20B (a pair of second metal electrode parts) in the integrated ground electrode unit 2. With this configuration, the occurrence of abnormal discharge at each of the metal electrodes 10A and 10B is effectively controlled. Similarly, the occurrence of abnormal discharge at each of the metal electrodes 20A and 20B is effectively suppressed.

With the effects described above, the active gas generating apparatus according to this embodiment prevents metal contamination caused by the abnormal discharge.

The active gas generating apparatus according to this embodiment, while having a relatively simple configuration without using a filter or the like, effectively prevents the metal contamination.

(Result of Simulation)

Figure 4:
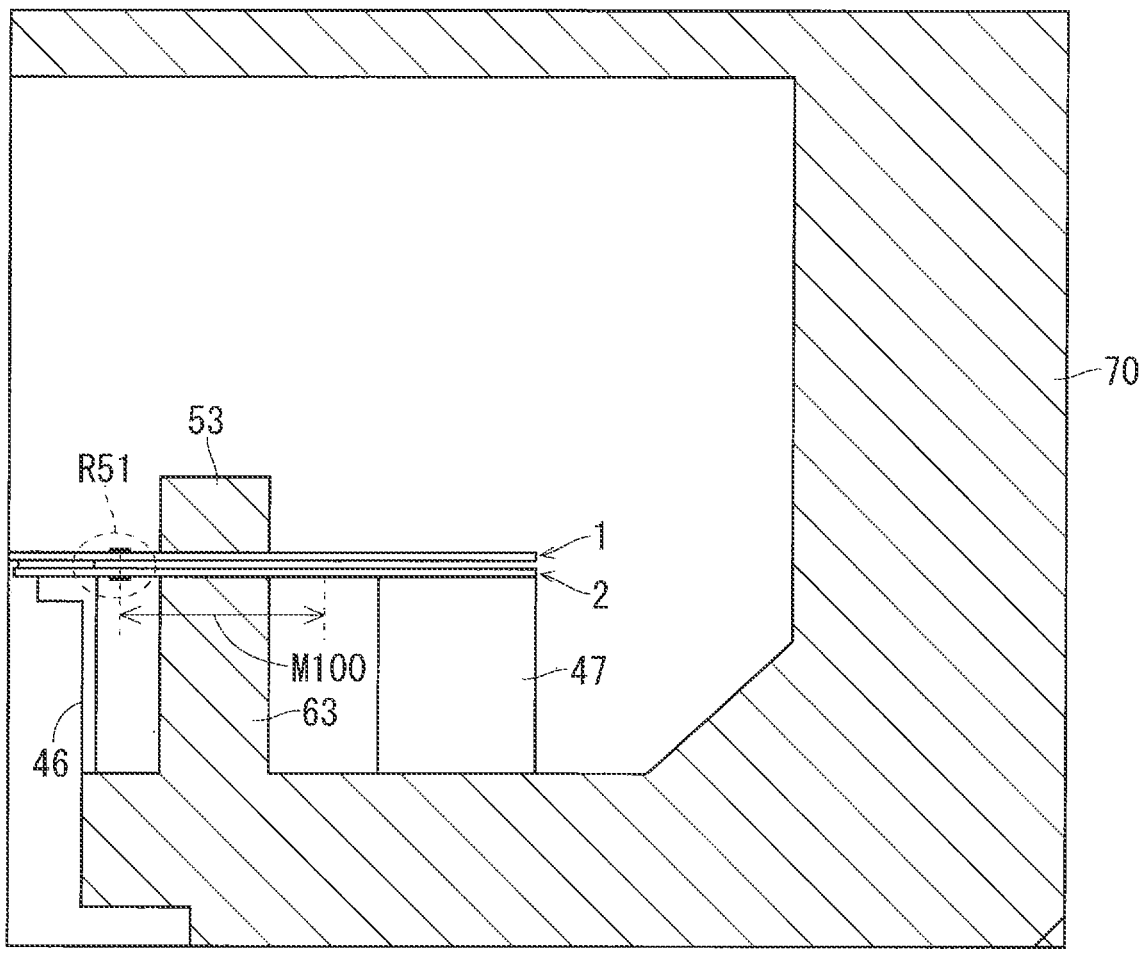
FIG. 4 is an illustrative diagram illustrating a result of a simulation (No. 1) in a conventional active gas generating apparatus.
Figure 5:
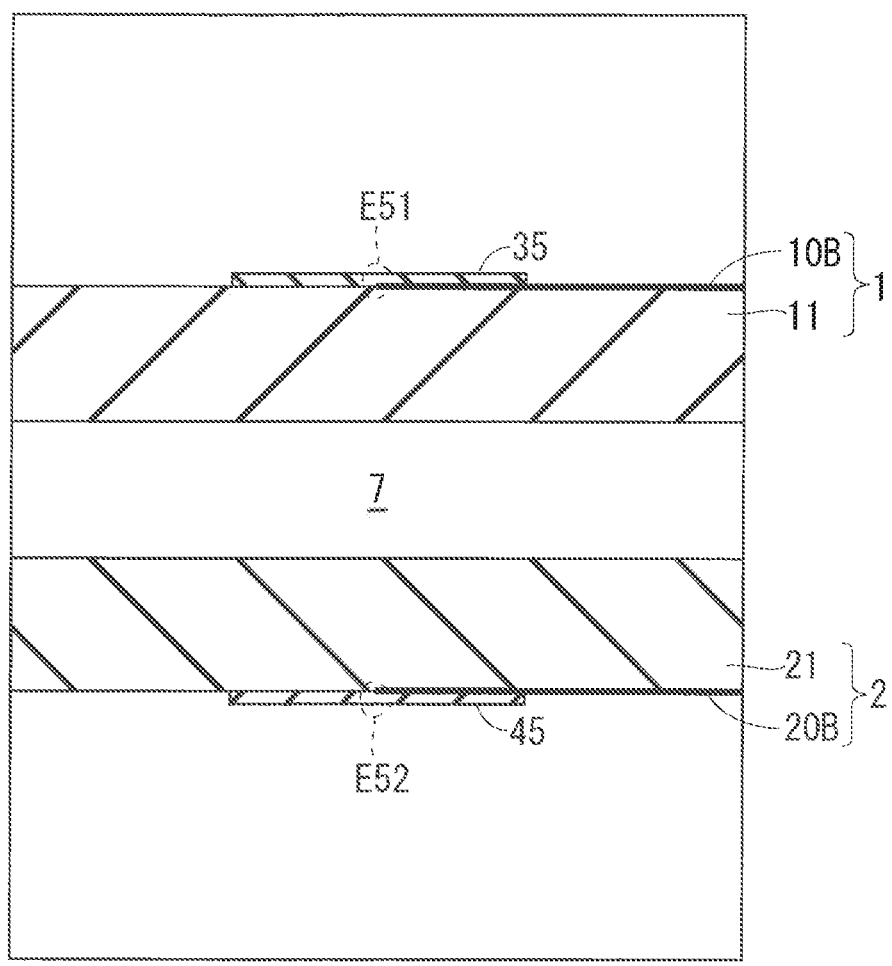
FIG. 5 is an illustrative diagram illustrating a result of the simulation (No. 2) the conventional active gas generating apparatus.

The effect of this embodiment will be described below with reference to a result of each simulation. Each of FIG. 4 and FIG. 5 is an illustrative diagram illustrating a result of a simulation in a conventional active gas generating apparatus. FIG. 5 is an enlarged view of a focused region R51 in FIG. 4.

Figure 6:
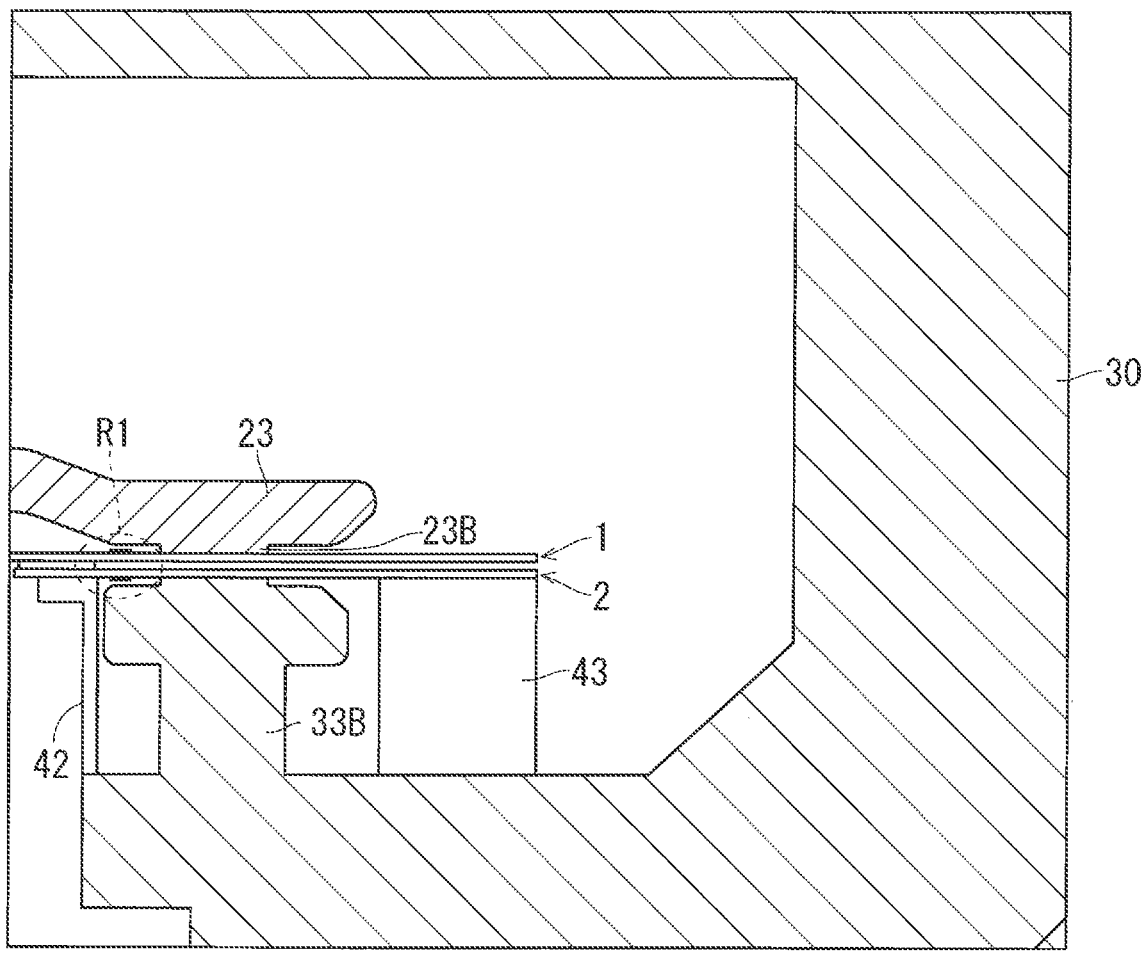
FIG. 6 is an illustrative diagram illustrating a result of a simulation (No. 1) in the active gas generating apparatus according to the embodiment.

Each of FIG. 6 and FIG. 7 is an illustrative diagram illustrating a result of a simulation in an active gas generating apparatus according to this embodiment. FIG. 7 is an enlarged view of a focused region R1 in FIG. 6. Simulation analysis conditions will be described below.

The high frequency power source 5 is set to supply the high-voltage electrode side with an alternating current voltage of 4400 V. Each of the dielectric electrode 11 and the dielectric electrode 21 is simulatedly formed of ceramic (relative dielectric constant of 9.9). Each of the covering dielectric 15A, the covering dielectric 15B, the covering dielectric 25A, and the covering dielectric 25B is set to have a relative dielectric constant of 4.4 and a thickness of 70 µm.

The covering dielectrics 15A and 15B respectively have a width W15A formed about the outer edge of the metal electrode 10A and a width W15B formed about the outer edge of the metal electrode 10B. The width 15A is set to have an entire length of 2 mm so as to have 1 mm on the metal electrode 10A and 1 mm on the dielectric electrode 11. The width 15B is set to have an entire length of 2 mm so as to have 1 mm on the metal electrode 10B and 1 mm on the dielectric electrode 11.

Similarly, the covering dielectrics 25A and 25B respectively have a width W25A formed about the outer edge of the metal electrode 20A and a width W25B formed about the outer edge of the metal electrode 20B. The width 25A is set to have an entire length of 2 mm so as to have 1 mm on the metal electrode 20A and 1 mm on the dielectric electrode 21. The width 25B is set to have an entire length of 2 mm so as to have 1 mm on the metal electrode 20B and 1 mm on the dielectric electrode 21.

Further, the discharge space 7 as the gap between the integrated high-voltage electrode unit 1 and the integrated ground electrode unit 2 is set at a length of 1 mm. Each of the dielectric electrode 11 and the dielectric electrode 21 is set to have a thickness of 1 mm. Each of the metal electrode 10A, the metal electrode 10B, the metal electrode 20A, and the metal electrode 20B is set to have a thickness of 10 µm.

As illustrated in FIGS. 4 and 5, the conventional active gas generating apparatus includes a power feeder 53 (in correspondence to the power feeder 23 of this embodiment) and a power feeder 63 (in correspondence to the power feeding unit 33 of this embodiment). The power feeder 53 and the power feeder 63 are respectively provided partially above and partially below a metal-electrode-provided region M 100. In other words, when seen in plan view, the power feeder 3 has a shape overlapping each of the metal electrodes 10A and 10B only partially and thus not covering the outer edges of the metal electrodes 10A and 10B. The power feeder 63, when seen in plan view, has a shape overlapping each of the metal electrodes 20A and 20B and thus not covering the outer edges of the metal electrodes 20A and 20B.

As illustrated in FIG. 5, the conventional active gas generating apparatus includes a covering dielectric 35 (in correspondence to the covering dielectric 15B of this embodiment) provided at the outer edge of the metal electrode 10B and a covering dielectric 45 (in correspondence to the covering dielectric 25B of this embodiment) provided at the outer edge of the metal electrode 20B. However, with the configuration described above, when an electric field generating region E51 is generated at the outer edge of the metal electrode 10B and an electric field generating region E52 is generated at the outer edge of the metal electrode 20B, each electric field generating region having an electric field intensity to cause a dielectric breakdown in a surrounding gas flow region, the electric field generating regions E51 and E52 are respectively larger n size than a film thickness of the covering dielectrics 35 and 45.

In other words, each of the electric field generating regions, having the electric field intensity to cause the dielectric breakdown in the surrounding gas flow region, is so expansive as to reach the surrounding gas flow region above the outer edge of the metal electrode 10B in the integrated high-voltage electrode unit 1 or below the outer edge of the metal electrode 20B in the integrated ground electrode unit 2.

The result of the simulation illustrated in FIGS. 4 and 5 confirms that the conventional active gas generating apparatus cannot suppress the occurrence of abnormal discharge at the outer edge of each of the metal electrodes 10A, the metal electrode 10B, the metal electrode 20A, and the metal electrode 20B.

On the other hand, the active gas generating apparatus according to this embodiment has the first feature and the second feature. With the first feature, the power feeder 23 has the shape covering each of the metal electrode 10A and the metal electrode 10B entirely in plan view. With the second feature, the power feeding unit 33 has the shape covering each of the metal electrode 20A and the metal electrode 20B entirely in plan view.

Accordingly, as illustrated in FIGS. 6 and 7, in the active gas generating apparatus according to this embodiment, when an electric field generating region E1 is generated at the outer edge of the metal electrode 10B and an electric field generating region E2 is generated at the outer edge of the metal electrode 20B, each electric field generating region having an electric field intensity to cause a dielectric breakdown in a surrounding gas flow region, the electric field generating regions E1 and E2 are respectively held within a film thickness of the covering dielectrics 15B and 25B. Thus, the electric field intensity to affect the surrounding gas flow is reliably controlled small.

The result of the simulation illustrated in FIGS. 6 and 7 confirms that the occurrence of abnormal discharge at the outer edge of each of the metal electrode 10A, the metal electrode 10B, the metal electrode 20A, and the metal electrode 20B is effectively suppressed.

While the present invention has been described in detail, the foregoing description is in all aspects illustrative and the present invention is not limited thereto. It is understood that innumerable modifications not illustrated may be envisaged without departing from the scope of the present invention.

The invention claimed is:

1. An active gas generating apparatus for generating an active gas obtained by activating a source gas supplied to a discharge space, said active gas generating apparatus comprising:
a first integrated electrode unit;
a second integrated electrode unit that is provided below said first integrated electrode unit; and
an alternating current source that applies an alternating current voltage to said first integrated electrode unit and said second integrated electrode unit in order to cause said first integrated electrode unit to be supplied with a high voltage, wherein
said alternating current source applies said alternating current voltage to form the discharge space between said first integrated electrode unit and said second integrated electrode unit,
the discharge space is supplied with the source gas that is activated to result in an active gas, said active gas being ejected from a gas ejection port that is provided in said second integrated electrode unit,
said first integrated electrode unit includes a first dielectric electrode, and a first metal electrode that is selectively formed on an upper face of said first dielectric electrode, and
said second integrated electrode unit includes a second dielectric electrode, and a second metal electrode that is selectively formed on a bottom face of said second dielectric electrode,
said active gas generating apparatus further comprising:
a first power feeding unit that is provided above said first metal electrode and configured to transmit said alternating current voltage to said first metal electrode; and
a second power feeding unit that is provided below said second metal electrode and configured to transmit said alternating current voltage to said second metal electrode, wherein
said second metal electrode includes a pair of second metal electrode parts that are formed opposite each other across a central region on said second dielectric electrode in plan view,
said first metal electrode includes a pair of first metal electrode parts, one of said pair of first metal electrode parts having a region overlapping one of said pair of second metal electrode parts in plan view, and other of said pair of first metal electrode parts having a region overlapping other of said pair of second metal electrode parts in plan view,
a part of said first power feeding unit is in contact with said first metal electrode and a part of said second power feeding unit is in contact with said second metal electrode,
said first power feeding unit includes a first projection and a second projection, each of said first projection and said second projection being selectively projected downward, a bottom face of said first projection being in contact with an upper face of one of said pair of first metal electrode parts, and a bottom face of said second projection being in contact with an upper face of other of said pair of first metal electrode parts, and
said first power feeding unit has a shape covering said first metal electrode entirely in plan view.

2. The active gas generating apparatus according to claim 1, wherein
said second power feeding unit has a shape covering said second metal electrode entirely in plan view.

3. The active gas generating apparatus according to claim 1, further comprising:
a first dielectric film that is formed on the upper face of said first dielectric electrode so as to entirely cover an outer edge of said first metal electrode; and a second dielectric film that is formed on the bottom face of said second dielectric electrode so as to entirely cover an outer edge of said second metal electrode.

4. The active gas generating apparatus according to claim 3, wherein said first dielectric film includes a pair of first dielectric film parts, each of which is formed on the upper face of said first dielectric electrode so as to entirely cover an outer edge of a corresponding one of said pair of first metal electrode parts, said second dielectric film includes a pair of second dielectric film parts, each of which is formed on the bottom face of said second dielectric electrode so as to entirely cover an outer edge of a corresponding one of said pair of second metal electrode parts, and said gas ejection port is formed in said central region.

* * * * *